United States Patent [19]

Kemp

[11] Patent Number: 5,196,833
[45] Date of Patent: Mar. 23, 1993

[54] LOW VOLTAGE DETECTOR CIRCUIT

[75] Inventor: Christopher J. Kemp, Monument, Colo.

[73] Assignee: Ford Motor Company, Dearborn, Mich.

[21] Appl. No.: 744,613

[22] Filed: Aug. 13, 1991

[51] Int. Cl.$^5$ .............................................. G08B 21/00
[52] U.S. Cl. ...................................... 340/663; 340/501
[58] Field of Search ................................. 340/663, 501

[56] References Cited

U.S. PATENT DOCUMENTS

| | | | |
|---|---|---|---|
| 4,053,717 | 10/1977 | Snider | 379/62 |
| 4,324,216 | 4/1982 | Johnson et al. | 123/415 |
| 4,491,691 | 1/1985 | Embree et al. | 379/373 |
| 4,567,333 | 1/9186 | Embree et al. | 379/375 |
| 4,595,885 | 6/1986 | Prieto et al. | 330/303 |
| 4,604,568 | 8/1986 | Prieto | 323/315 |
| 4,613,768 | 9/1986 | Pommer, II | 307/350 |
| 4,628,272 | 12/1986 | Davis et al. | 329/336 |
| 4,701,639 | 10/1987 | Stanojevic | 307/350 |
| 4,882,761 | 11/1989 | Waldhauer | 381/106 |
| 4,924,212 | 5/1990 | Fruhauf et al. | 340/598 |
| 5,122,920 | 6/1992 | Pease | 340/663 |

Primary Examiner—Glen R. Swann, III
Attorney, Agent, or Firm—Richard D. Dixon; Roger L. May

[57] ABSTRACT

A low voltage detection circuit includes bandgap and differential comparator circuits for generating a first signal proportional to the level of the supply voltage when it exceeds a predetermined range, and an output driver responsive to the first signal for generating an output indication representative of a low or failure condition of the supply voltage.

A supplemental current source provides a bias current to the output driver in opposition to and much smaller than the first signal in order to proactively switch the output driver into the low or failure condition when the supply voltage, and the first signal representative thereof, fall below a predetermined minimum range.

7 Claims, 2 Drawing Sheets

LOW VOLTAGE DETECTOR CIRCUIT

BACKGROUND OF THE INVENTION

1. Field of the Invention

The present invention relates to electronic circuitry of the type used in an integrated circuit for detecting when the supply voltage to the integrated circuit falls below a predetermined level indicative of a possible interruption in the functioning of the integrated circuit or corruption of data within RAM memory coupled to the same supply voltage.

2. Prior Art

Voltage threshold detectors and low voltage detector circuits are well known in the prior art. Typically these circuits generate a logic signal output indicating whether a monitored voltage is either over or under a specified reference level. This output signal may then be used to disable other circuits in order to prevent improper operation caused by low voltage conditions.

In applications such as automotive electronic systems it is important to maintain adequate supply voltages to integrated circuits controlling such key functions as engines, chassis/suspension, anti-lock brakes, etc. For example, in an engine control computer it is highly desirable to maintain current indications of engine performance in a look-up table contained in RAM memory. These current values allow the engine control computer to provide optimum performance of the engine depending upon various conditions such as changing altitude, temperatures, humidity, air mass/density, etc. These values are typically updated on a frequent basis while the vehicle is operating. Critical performance parameters, such as fuel economy, can be degraded if the data in the RAM memory is corrupted and the engine control computer thereafter uses the incorrect data. Under such circumstances it is preferable to use preset values optimized for engine startup conditions, and then redevelop the data required to optimize performance based upon actually encountered conditions.

One major concern in low voltage detector circuits found in the prior art is temperature compensation. For example, automotive electronic modules and systems must perform to demanding electrical specifications over a wide range of temperatures from sub-artic cold through desert heat without appreciably affecting the performance of the vehicle systems. Another major concern is the wide range of voltages which may appear from the vehicle's electrical power system due to transient loads caused by starting major electrical systems such as the starter motor, the air conditioner, headlight or other lighting systems, etc.

Given the wide range of ambient temperatures and supply voltage variations encountered in typical automotive environments, it therefore becomes important to monitor and maintain the proper performance of key automotive electronic systems. Since supplemental voltage reference sources are not available in typical automotive applications, it is desirable to utilize a low voltage detection circuit that not only monitors the voltage from the vehicle power supply source, but also is powered from the same voltage source. This complicates the design of such low voltage detector circuits because without the use of external voltage references the low voltage detector circuit may provide false indications of vehicle power supply conditions when the power supply voltage drops to very low levels.

Several different attempts to design low voltage detection circuits that are functional over wide temperature variations and supply voltage conditions are illustrated in the prior art. For sake of example, Pommer, in U.S. Pat. No. 4,613,768, discloses a temperature dependent voltage reference and voltage comparator comprising a three terminal circuit. While this circuitry is capable of providing adequate voltage reference comparisons over a wide range of temperature variations, the circuit is subject to providing false indications of supply voltage conditions as the supply voltage itself drops below a minimum critical value.

Waldhauer, in U.S. Pat. No. 4,882,761, discloses a programmable low voltage audio compressor circuit suitable for use with hearing aids. The device includes a bandgap reference cell which is used in conjunction with a preregulator and operational amplifier to control the supply voltage more accurately as the battery powering the hearing aid deteriorates in performance. As with other prior art references, this invention does not appear to resolve the problem of providing an accurate indication of power supply status in low voltage and low temperature conditions.

Johnson, in U.S. Pat. No. 4,324,216, discloses an electronic ignition control system for an internal combustion engine, including a sophisticated electronic timing advance system. While the inventor recognizes the wide temperature and voltage fluctuations expected for proper operation of the system in the automotive environment, the low voltage detection circuits apparently do not provide for sensing and then disabling critical electronic functions in response to the power supply voltage dropping below the predetermined critical level.

While the prior art may reflect the use of a differential comparator circuit in combination with a bandgap type input, the comparator in the prior art circuits would cease to function when the supply voltage $V_{DD}$ drops to very low levels. This failure mode results in the prior art circuitry going into an undetermined state when the voltage drops below that required for the proper operation of the combination of the differential comparator and bandgap input circuitry.

In contrast to the prior art, the present low voltage detector (LVD) circuit provides a normal output signal when the power supply voltage is above a specified minimum value and a second or failure signal when the power supply voltage, also known as $V_{DD}$, falls below this predetermined limit. This specified minimum value of $V_{DD}$, also known as the "trip point", is usually relatively low (e.g., less than two volts) and controlled within a narrow tolerance over the entire temperature range of operation (e.g., $-40°$ to $+125°$ centigrade). Typical specifications for automotive applications of this type require that the low voltage detection circuit meet or exceed a 1.8 volt $+/-0.3$ volt trip point specification, and that the circuit can be economically fabricated on a conventional n-well CMOS digital semiconductor manufacturing process.

SUMMARY OF THE INVENTION

The present invention provides a low voltage detection circuit that operates accurately over a wide range of ambient temperatures for detecting the supply voltage of the same power supply that provides the energy for operating the detector.

The low voltage detector includes voltage sensing circuitry, comprising a bandgap cell and a differential amplifier, coupled to and powered by the supply voltage source. The output of this sensing or comparator circuitry is coupled to an output driver for signaling when the supply voltage is above or below a predetermined limit or range (the trip point).

The present invention includes an additional current source that is coupled so as to produce a signal that is in opposition to the signal produced by the comparator, with the signal from the current source being designed to change the output driver from signaling the proper operation of the supply voltage source to an improper operation indication as the voltage from the supply source drops below the predetermined limit or range. The magnitude of the signal from the comparator is typically much larger than the opposing signal from the current source under normal operating conditions. However, the level of the signal from the additional current source is much less affected by temperature and low voltage conditions so as to override a weak signal from the comparator as the supply voltage drops below the predetermined limit, thus proactively switching the output driver to indicate a low voltage condition.

DETAILED DESCRIPTION OF THE PREFERRED EMBODIMENT

Figure 1:
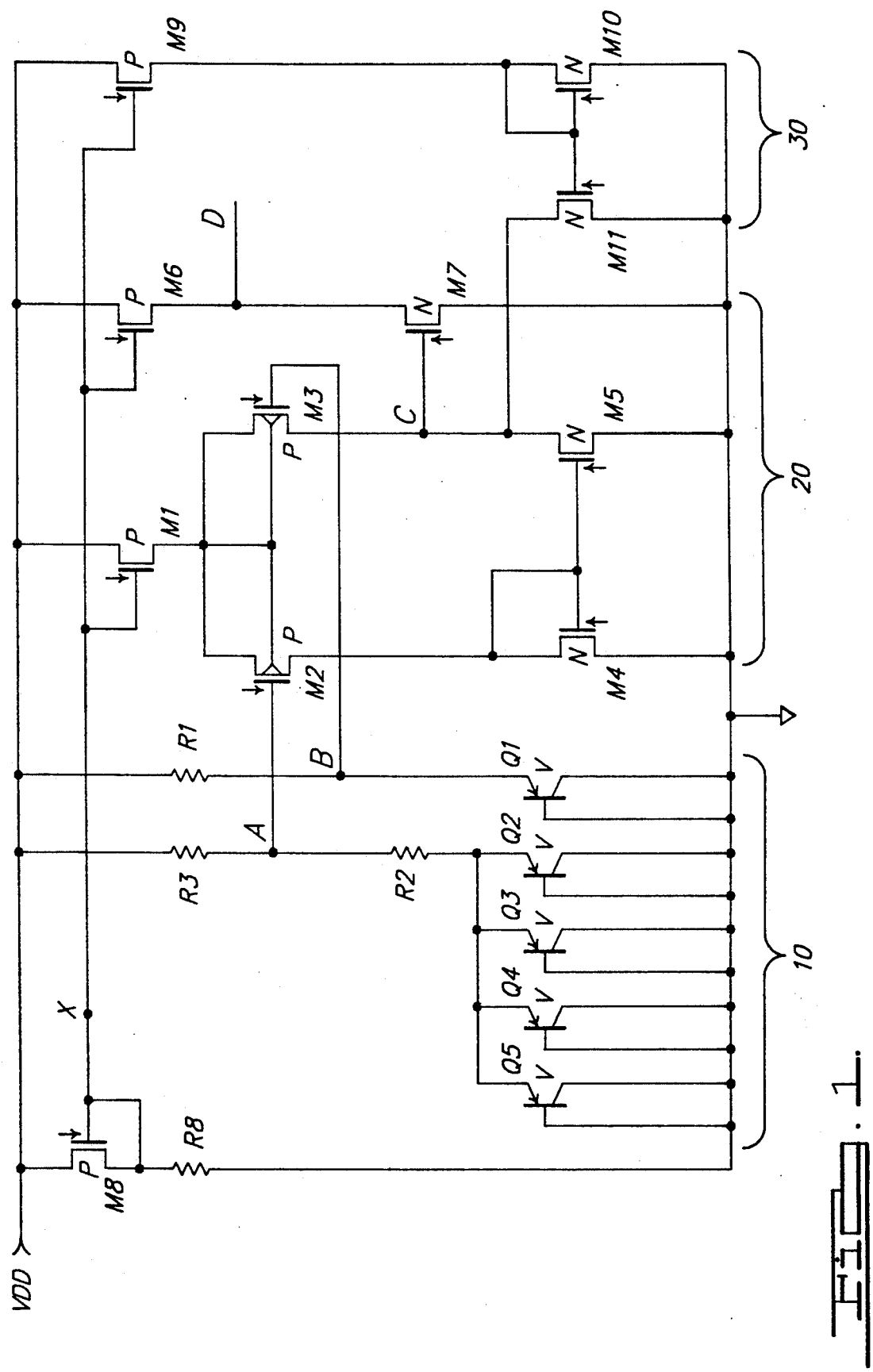
FIG. 1 is a schematic diagram of a first preferred embodiment of the low voltage detector circuit.

The first preferred embodiment of the present invention is illustrated generally in FIG. 1 as including bandgap circuitry, shown generally as 10, a differential comparator, shown as 20, and a current source for improving operation in the low voltage and low temperature ranges, shown generally as 30.

The bandgap cell 10, which is connected between a regulated power supply voltage (approximately 5 volts) $V_{DD}$ and ground, includes a resistor bridge having a node A formed by resistors R3 and R2 in combination with transistors Q2, Q3, Q4 and Q5, and having node B formed by resistor R1 and transistor Q1. In the preferred embodiment, resistor R1 has a value of 200k ohms, resistor R2 has a value of 25k ohms, and resistor R3 has a value of 400k ohms.

Nodes A and B from the bandgap circuit 10 also serve as inputs to the differential comparator formed from transistors M2 and M3. Transistor M1 operates as a current source for transistors M2 and M3, while transistors M4 and M5 are connected in the conventional current mirror configuration in order to act as an active load for enhancing the effective gain of the differential comparator transistors M2 and M3. The output of the differential comparator 20, shown as node C, is connected to transistor M7 which functions as a gain stage to drive an output load transistor M6 which defines another output node D. It will be apparent that other stages, such as an inverter stage, may be coupled to the output node D to adjust the polarity and magnitude of the desired output signals.

P-channel transistors M2 and M3 are generally the same in size and performance characteristics, and in the preferred embodiment they have a typical gate length/width of 60/10 micrometers. N-channel transistors M4 and M5 are generally the same in size and performance characteristics with typical gate lengths/widths of 40/10 micrometers in the preferred embodiment.

The bandgap cell 10 is a well known circuit configuration, the operation of which may be illustrated as follows. Transistor Q1 is a substrate pnp transistor which is connected as a diode. Transistors Q2, Q3, Q4, and Q5 are generally the same size and performance characteristics as Q1, but since they are connected in parallel they form an equivalent device which is four times the effective size of Q1. The fact that this equivalent device is larger, combined with the fact that R3 has typically twice the resistance of R1, causes the voltage at node A to be lower than the voltage at node B whenever the voltage at $V_{DD}$ is below a critical threshold value, or "trip point".

As the supply voltage $V_{DD}$ increases above this threshold value, the current through transistors Q2, Q3, Q4, and Q5 also will increase, thereby increasing the voltage drop across resistor R2. Using well known circuit analysis techniques, the voltage at node A may be designed to be equal to the voltage at node B for a particular value of $V_{DD}$ by adjusting the ratios of resistors R1, R2, and R3 in conjunction with the sizing of transistors Q1, Q2, Q3, Q4 and Q5. In the preferred embodiment of the present invention the sizing of these circuit elements is adjusted so that the voltage at node A will be generally equal to and then exceed the voltage at node B when $V_{DD}$ rises above the range of 1.5 to 2.1 volts (the range depends on ambient operating temperatures and other variables). Therefore, under normal operating conditions, when the voltage at node A drops below the voltage at node B, output node C of the differential comparator 20 will change state, thereby signaling that supply voltage $V_{DD}$ has dropped below its minimum operating voltage range.

This "trip point" range of 1.5 to 2.1 volts for $V_{DD}$ is chosen such that the operation of other devices also driven from $V_{DD}$, such as volatile memory and other critical circuitry, can be monitored and protected. For example, if data values stored in volatile RAM memory also coupled to $V_{DD}$ become corrupted below a supply voltage in the range 1.5 volts, then the present circuit can be used to generate a signal to be utilized by other circuits designating that the data values contained in RAM memory may be corrupted and therefore should be disregarded (such as by using start-up values from a look-up table or other similar power-on reset or initializing functions).

Figure 2:
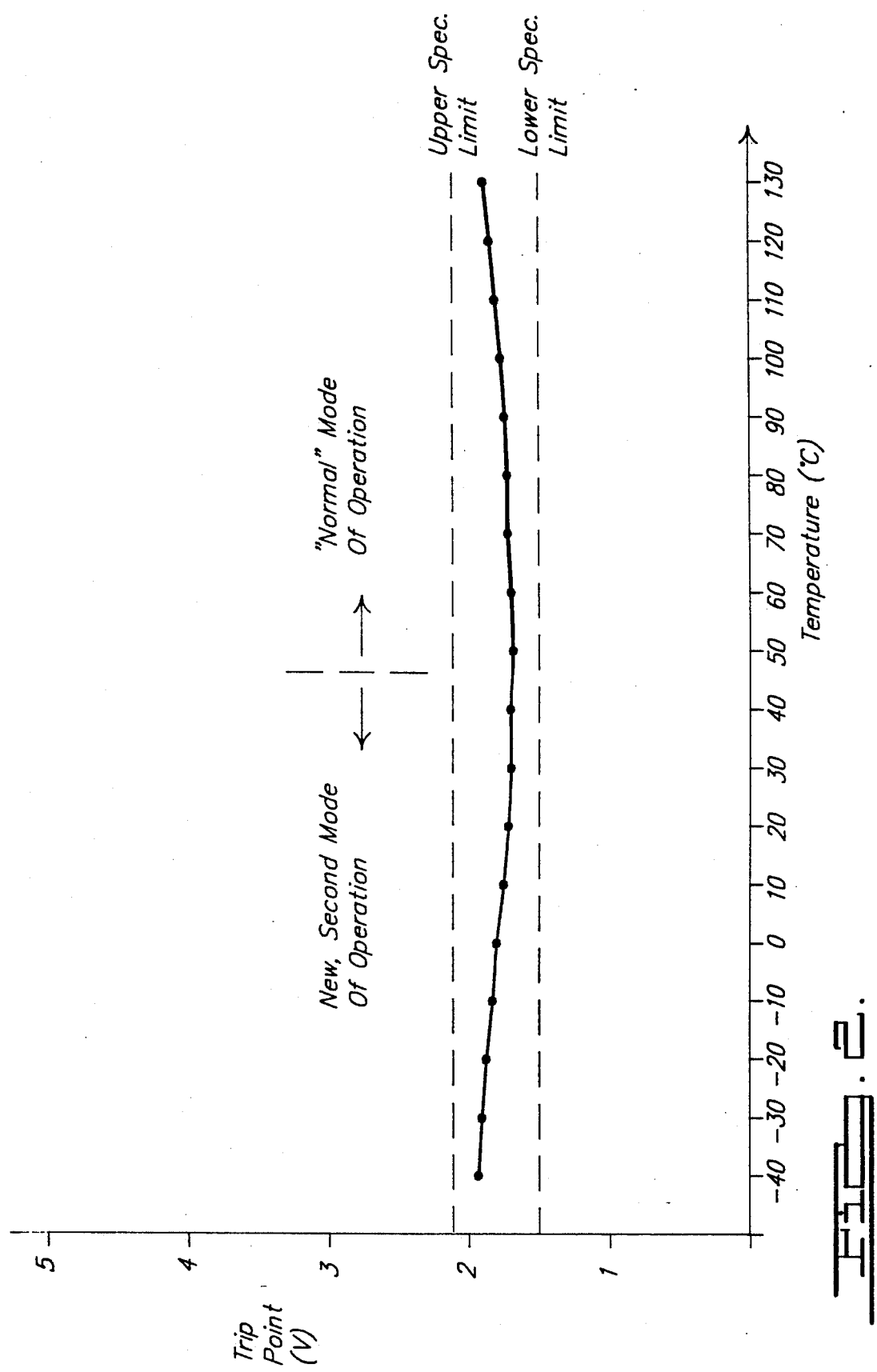
FIG. 2 is a graph of the trip point for the low voltage detector circuit as a function of the ambient operating temperature. The upper and lower specification voltages are also indicated.

The problem being addressed by the present invention may now be understood more readily with reference to FIG. 2. As the ambient temperature of the circuit decreases below a nominal operating temperature of 40° C., the voltages which exist across the emitter base junctions of the bipolar transistors, as well as the voltages across the gate-source junctions of the MOS transistors, increase at the rate of approximately two millivolts per degree centigrade. This causes the voltage across current source transistor M1 in the differential comparator circuit 20 to decrease. If at the same time the supply voltage $V_{DD}$ drops below 2.1 volts, the voltage across current source transistor M1 is reduced further, and eventually the current through M1 will be reduced to a very low level because of this insufficient voltage. These conditions would normally cause the comparator 20 to cease functioning, rendering it unable to signal a low voltage condition. Of course, if $V_{DD}$ drops to 1.5 volts, then the data within RAM memory also connected to $V_{DD}$ can be corrupted. Since other prior art low voltage detection circuits would not activate under the previously described low voltage conditions, the remainder of the integrated circuit could continue to operate normally in spite of the likelihood that corrupted data could be used in subsequent calculations. This combination of low temperature and low $V_{DD}$ can be corrected through the use of a current source which supplies additional current and "voltage headroom" to the differential comparator 20 under such conditions.

With reference to FIG. 2, the upper specification limit for voltage $V_{DD}$ and the lower specification limit for voltage $V_{DD}$ are shown as being approximately 2.1 and 1.5 volts, respectively. Illustrating the proper performance of the first preferred embodiment of the present invention, the "trip point" line remains between the upper and lower specification limits throughout the temperature range under which the circuit must operate. Note that above the upper specification limit a comment has been placed showing that the "normal" mode of operation (typically above 40° C.) is the same as has been described above. The new or second mode of operation, which will compensate for inherent performance degradation of the circuit at low voltage and temperature conditions, will now be described.

With reference to FIG. 1, a current source, shown generally as 30, is included at node C between one leg of the differential comparator (at transistor M3) and ground. The current source 30 comprises a first transistor M11 that functions as a current source, a second transistor M10 that functions as a current mirror, and a third transistor M9 that functions as a reference current source proportional to the current through M1. The current generated by the current source 30 is proportional to the "tail current" of the differential comparator 20 flowing through transistor M1. In the preferred embodiment of the present invention, P-channel transistor M1 is a 50/10 micrometer device, while N-channel transistors M9 and M11 are 10/10 micrometer devices. The current mirror transistor M10 is a 20/10 micrometer N-channel device. This selected ratio of the sizes of transistors M1, M9, M10 and M11 means that, under normal operating conditions, the current leaving node C and entering the current source 30 is exactly 1/10 of the tail current through transistor M1 in the differential comparator 20.

Under normal operation of the differential comparator 20, the tail current flowing through transistor M1 will be split, with a portion of the current flowing through transistor M2 into transistor M4 and then to ground, while the remaining portion of the tail current flows through transistor M3 and then through active load transistor M5 in parallel with the current source 30. The relative ratio of the currents in these two legs will depend upon the voltages present at nodes A and B at the input of the differential comparator 20. In the absence of the current source 30, output transistor M7, having its gate connected to node C, will switch between the conducting and nonconducting states when the current through transistor M3 is equal to the current through transistor M2. The function of current source 30 is to extend the normal voltage operating range of the differential comparator 20 when $V_{DD}$ falls below its critical low voltage specification.

The current developed by the current source 30 acts as a bias current, or a current offset, which under normal operating conditions is very small in comparison with and flows in opposition to currents normally flowing through transistor M5, but which will cause the output of driver transistor M7 to go high in the absence of any input from transistor M3. While this bias current causes a small "trip point" error under normal $V_{DD}$ conditions, this current is sufficient to positively switch transistor M7 when the voltage headroom for transistor M1 is effectively exhausted. This current source 30 effectively extends the low temperature operating voltage capability of the differential comparator 20, which could not otherwise perform satisfactorily at low temperatures, and allows the output to remain at the desired high level (signaling a low voltage condition) when both $V_{DD}$ voltage drops low and temperature is below approximately 40° C.

Since the current produced by the current source 30 is in the opposite direction with respect to the current normally flowing through transistor M3, the current through M3 normally overcomes the operation of current source 30 and causes the output of transistor M7 to go low. However, when the current through transistor M3 goes to zero as the $V_{DD}$ voltage drops below that which is required for proper operation of the comparator 20, then the current produced by current source 30 will cause the voltage output at transistor M7 and node D to go high, thereby signaling a failure mode or a warning signal for disabling other circuits coupled to $V_{DD}$ as previously explained.

As will be appreciated by one skilled in this art, the interaction of the bias current from current source 30 and the normal drive current from transistor M3 at node C of the differential comparator 20 will produce the desired transfer function at low temperatures (below approximately 40° C.) as shown in FIG. 2. The operation of the present circuitry compensates for the threshold voltages of MOSFET transistors and the $V_{BE}$ of the bipolar transistors going up as a function of the temperature being reduced.

Resistor R8, nominally a 400k ohm resistor in the preferred embodiment, acts as a bias resistor in conjunction with transistor M8, which functions as a MOS connected diode. Therefore, any other gate of a P-channel device connected to node X will have mirrored into it the same current as flows through transistor M8, provided that the two transistors are of the same size. For example, since transistor M8 and transistor M1 are the same relative size (50/10 micrometers), the same current will flow through transistor M1 as flows through transistor M8. Likewise, since transistor M6 is the same size as transistors M1 and M8, the same current will flow through transistor M6 as transistor M8. However, since transistor M9 is only a 10/10 micrometer device, only 1/5 of the current will flow through transistor M9 as flows through transistor M8. In effect, transistor M6 acts as current source load for output transistor M7, while transistor M9 acts as a current source load for the small current required for transistor M10. As previously explained, transistor M10 is the current mirror that drives current source M11 into node C.

Various modifications and variations will no doubt occur to those skilled in the various art to which is invention pertains. For example, the particular implementation of the concepts discussed above may be varied from that disclosed herein. These and all other variations which basically rely on the teachings through which this disclosure has advanced the art are properly considered with the scope of this invention as defined by the appended claims.

I claim:

1. A temperature insensitive low voltage detector, adapted for implementation on an integrated circuit, for generating a warning signal when the supply voltage powering the integrated circuit drops below a redetermined range, comprising:
   comparator means, coupled to and powered by the supply voltage, for generating at a signal node an operating signal which is generally proportional to the level of the supply voltage when it exceeds the predetermined range,
   failure driver means, coupled to and powered by the supply voltage and having an output node coupled to said signal node, for generating at said output node a failure signal that is generally constant for supply voltages near the predetermined range and in opposition to said operating signal, said failure signal being generally much smaller than said operating signal under normal temperature and voltage supply conditions but which in comparison becomes larger than said operating signal when the supply voltage drops below the predetermined range, and
   output driver means, coupled to and powered by the supply voltage and having an input node coupled to said signal node, for generating at an output thereof warning signal responsive to said failure signal exceeding said operating signal.

2. The low voltage detector circuit recited in claim 1 wherein said comparator means comprises:
   bandgap reference means for generating a differential signal at outputs thereof responsive to the level of the supply voltage, and
   differential comparator means having inputs coupled to said outputs of said bandgap reference means for generating said operating signal at said signal node thereof.

3. The low voltage detector circuit recited in claim 1 wherein said failure driver means comprises a current source for generating as said failure signal a current in opposition to said operating signal, thereby biasing said output driver means positively into generating said warning signal responsive to said failure signal excluding said operating signal.

4. A low voltage detector adapted for implementation on an integrated circuit for generating a warning signal when the supply voltage powering the integrated circuit drops below a predetermined trigger point level, comprising:
   comparator means, coupled to and powered by the supply voltage, for generating at a signal node thereof an operating signal current which is generally proportional to the level of the supply voltage when it exceeds the trigger point level,
   opposing current means, coupled to and powered by the supply voltage and having an output node coupled to said signal node, for generating at said output node a bias current that is in opposition to said operating signal current and generally constant in magnitude for supply voltages near the trigger point level, said bias current being generally much smaller than said operating signal current under normal temperature and voltage supply conditions but which in comparison becomes larger than said operating signal current when the supply voltage drops below the trigger point level, and
   output driver means, powered by the supply voltage and having an input node coupled to said signal node, for generating at an output thereof the warning signal responsive to said bias current becoming larger than said operating current.

5. The low voltage detector circuit recited in claim 4 wherein said comparator means comprises:
   bandgap reference means for generating a differential signal at outputs thereof responsive to the level of the supply voltage, and
   differential comparator means having inputs coupled to said outputs of said bandgap reference means for generating said operating signal current at said signal node thereof.

6. A low voltage detector adapted for implementation on an integrated circuit for generating a reset signal when the supply voltage powering the integrated circuit drops below a predetermined trigger point level, said detector including comparator means, coupled to and powered by the supply voltage, for generating at a signal node thereof an operating current generally proportional to the level of the supply voltage when it exceeds the trigger point, and output driver means, coupled to and powered by the supply voltage and having an input node coupled to said signal node, for generating at an output thereof the reset signal responsive to said operating current falling below a minimum level representative of the trigger point level, and wherein the improvement comprises:
   opposing current means, coupled to and powered by the supply voltage and having an output node coupled to said signal node, for generating at said output node an opposing current that is in opposition to said operating current and generally constant in magnitude for supply voltages near the trigger point, said opposing current being generally much smaller than said operating current under normal temperature and voltage supply conditions but which in comparison becomes larger than said operating current when the supply voltage drops below the predetermined trigger point level.

7. The low voltage detector circuit recited in claim 6 wherein said comparator means comprises:
   bandgap reference means for generating a differential signal at outputs thereof responsive to the level of the supply voltage, and
   differential comparator means having inputs coupled to said outputs of said bandgap reference means for generating said operating current at said signal node thereof.

* * * * *